(12) United States Patent
Choi

(10) Patent No.: US 6,724,090 B2
(45) Date of Patent: Apr. 20, 2004

(54) MULTI-CHIP PACKAGE AND METHOD FOR MANUFACTURING THE SAME

(75) Inventor: Shin Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/338,202

(22) Filed: Jan. 8, 2003

(65) Prior Publication Data

US 2003/0197283 A1 Oct. 23, 2003

(30) Foreign Application Priority Data

Apr. 23, 2002 (KR) .................................... 2002-22113

(51) Int. Cl.$^7$ ............................................ H01L 23/48
(52) U.S. Cl. ........................................ 257/777; 257/685
(58) Field of Search ........................... 257/777, 685, 257/686, 723

(56) References Cited

U.S. PATENT DOCUMENTS

| | | | | |
|---|---|---|---|---|
| 5,448,511 A | * | 9/1995 | Paurus et al. | 365/52 |
| 5,646,446 A | * | 7/1997 | Nicewarner et al. | 257/723 |
| 5,789,815 A | * | 8/1998 | Tessier et al. | 257/723 |
| 6,072,236 A | | 6/2000 | Akram et al. | |
| 6,121,676 A | * | 9/2000 | Solberg | 257/686 |
| 6,124,634 A | | 9/2000 | Akram et al. | |
| 6,207,548 B1 | | 3/2001 | Akram et al. | |
| 6,208,521 B1 | * | 3/2001 | Nakatsuka | 361/749 |
| 6,225,688 B1 | * | 5/2001 | Kim et al. | 257/686 |
| 6,232,659 B1 | * | 5/2001 | Clayton | 257/724 |
| 6,300,679 B1 | * | 10/2001 | Mukerji et al. | 257/738 |
| 6,358,833 B1 | | 3/2002 | Akram et al. | |
| 6,376,769 B1 | | 4/2002 | Chung | |
| 6,407,451 B2 | | 6/2002 | Akram et al. | |
| 6,459,148 B1 | * | 10/2002 | Chun-Jen et al. | 257/692 |
| 6,462,412 B2 | * | 10/2002 | Kamei et al. | 257/723 |
| 6,486,544 B1 | * | 11/2002 | Hashimoto | 257/686 |
| 6,600,222 B1 | * | 7/2003 | Levardo | 257/686 |
| 2003/0062614 A1 | * | 4/2003 | Larson | 257/688 |
| 2003/0168725 A1 | * | 9/2003 | Warner et al. | 257/686 |

* cited by examiner

*Primary Examiner*—Jasmine Clark
(74) *Attorney, Agent, or Firm*—Ladas & Parry

(57) ABSTRACT

Disclosed are a multi-chip package and a method for manufacturing the multi-chip package. The multi-chip package comprises: a circuit substrate consisting of first, second and third areas which surround three sides of the multi-chip package; and at least two semiconductor chips which are positioned within an internal space of the package defined by the internal surfaces of the above three areas, wherein the semiconductor chips are physically bonded and electrically connected to each other. The method for manufacturing a multi-chip package comprises the steps of: providing a circuit substrate matrix formed with a plurality of unit circuit substrates, each substrate consisting of first, second and third areas; bonding semiconductor chips each unit circuit substrate, so that those chips are physically bonded and electrically connected to the unit circuit substrate; separating unit circuit substrates from the circuit substrate matrix; and folding the unit circuit substrate.

10 Claims, 14 Drawing Sheets

MULTI-CHIP PACKAGE AND METHOD FOR MANUFACTURING THE SAME

BACKGROUND OF THE INVENTION

1. Field of the Invention

The present invention relates to a semiconductor package, and more particularly to a multi-chip package for implementing two or more semiconductor chips of different sizes and functions with one package.

2. Description of the Prior Art

In the semiconductor industry, the packaging technique for IC chips is continuously progressing. In particular, with the recent development of the information and communication industry, efforts have been continuously made to develop small, light and multifunctional packages. As a result of such efforts, a so-called "multi-chip package" has been proposed.

Such a multi-chip package is to increase memory capacity by stacking memory chips of a same size and function or to maximize the performance and efficiency of products by assembling various kinds of semiconductor chips of different sizes and functions. For example, two or more DRAMs are stacked to realize a high capacity, and a SRAM, a flash memory, an RF chip, etc. are simultaneously packaged and applied to a small and light portable communication device or the like.

There are many types of multi-chip packages according to their end-use products, makers, etc. Two typical examples of multi-chip packages according to the prior art are shown in FIGS. 1 and 2.

Figure 1:
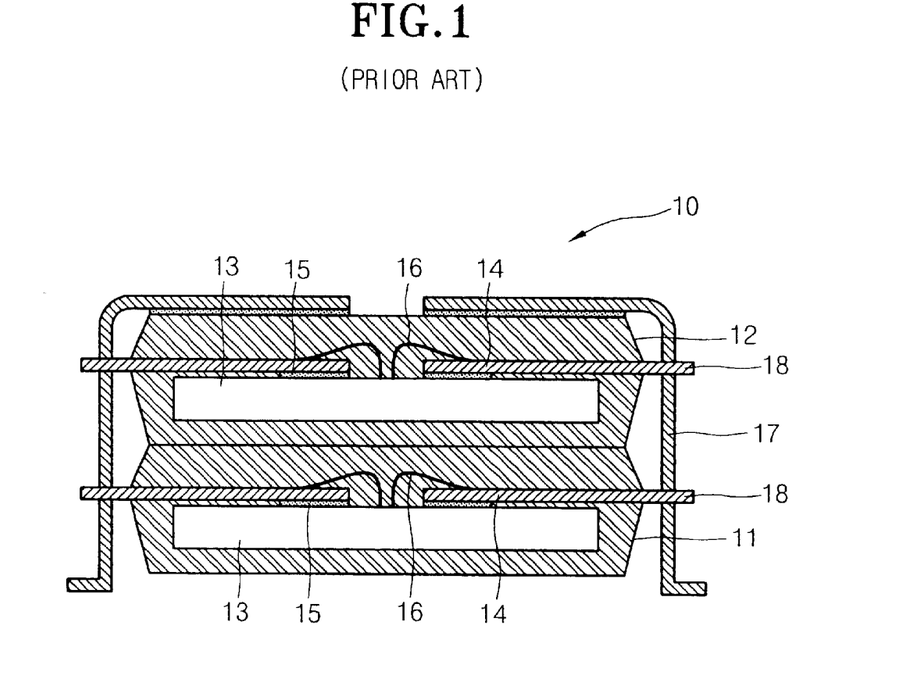
FIG. 1 is a cross-sectional view which shows an example of a multi-chip package according to the prior art.
Figure 2:
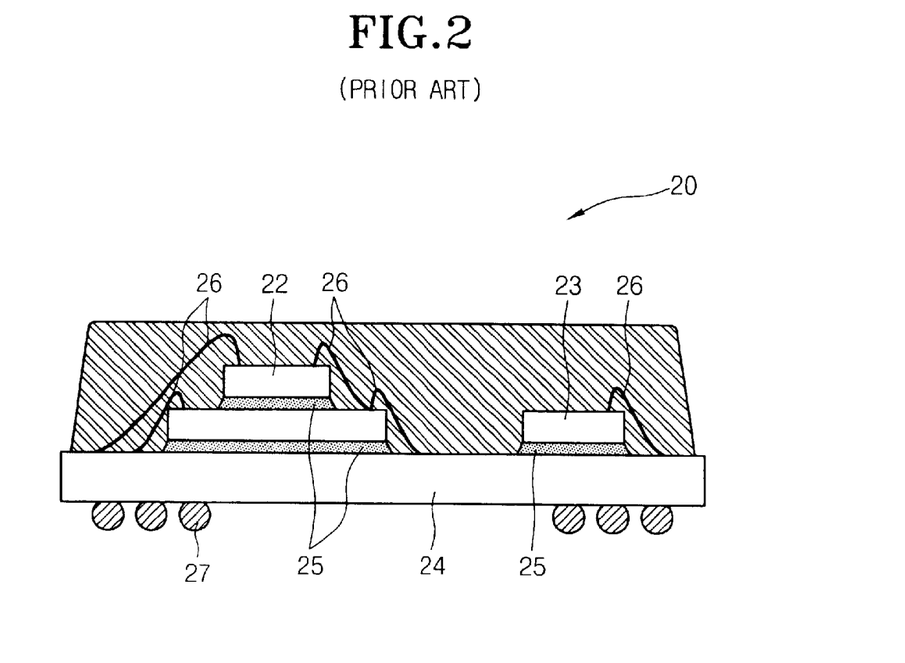
FIG. 2 is a cross-sectional view which shows another example of a multi-chip package according to the prior art.

The conventional multi-chip package 10 shown in FIG. 1 is a type of thin small outline package (TSOP), in which individual packages 11, 12 are stacked. Whereas, the conventional multi-chip package shown in FIG. 2 is a type of ball grid array (BGA), in which individual semiconductor chips 21, 22, 23 are vertically stacked or horizontally arranged and then collectively packaged.

In the multi-chip package 10 shown in FIG. 10, the individual packages 11, 12 each comprise one semiconductor chip 10 and employ a lead-on-chip (LOC) lead frame. One or more internal leads 14 of the lead frame are adhered to the top surface of the semiconductor chip 13 by an adhesive tape and each electrically connected to the semiconductor chip 13 by a gold wire 16. The upper and lower stacked packages 11 and 12 are electrically interconnected by means of one or more separate connection leads 17. Herein, the connection leads 17 are bonded to one or more external leads 18 of each lead frame and serve as external connection terminals.

The multi-chip package 20 forms a single package, in which semiconductor chips 21, 22 and 23 are vertically stacked or horizontally arranged on one side of a printed circuit substrate 24. An adhesive 25 provides physical adhesion between the semiconductor chip 21 and the semiconductor chip 21 or between the semiconductor chips 21 and 22 and the semiconductor chip 23 and gold wires 26 provide electrical connection therebetween. The other side of the circuit substrate 24 is provided with solder balls that serve as external connection terminals.

The conventional multi-chip packages as described above have various disadvantages to be described below.

The multi-chip package 10 shown in FIG. 1 has a disadvantage in that its total height is increased because it is a package-stacked type. Therefore, it is difficult to apply the multi-chip package 10 of this type to a portable communication device. Furthermore, the chips 13 employed in the multi-chip package 10 must have a same size. If the chips 13 are of different sizes, the connection parts between the individual packages 11, 12 and/or between the external leads 18 and the interconnection leads 17 may be fractured due to a package warping phenomenon caused by the difference of thermal expansion coefficients thereof.

The multi-chip package 20 has a limit in vertically stacking the semiconductor chips 21, 22, 23. In this regard, if the semiconductor chips 21, 22, 23 are horizontally arranged, a problem arises in that the area of the multi-chip package 20 is increased. In addition, if memory chips of a same type are employed to increase the memory capacity, there will be a problem in that it is difficult to stack the chips as a result of the memory chips being same in size.

Meanwhile, the multi-chip packages shown in FIGS. 1 and 2 have a common problem in that they are not suitable for the products of high-speed devices because gold wires 16, 26 are used as electrical connection means.

SUMMARY OF THE INVENTION

Accordingly, the present invention has been made to solve the above-mentioned problems occurring in the prior art, and an object of the present invention is to provide a multi-chip package, in which not only memory chips of a same type are stacked to be capable of increasing the memory capacity, but also memory chips of different types are compositely arranged to be capable of implementing a system-on-package having various functions.

It is also an object of the present invention to minimize the thickness and area of a multi-chip package, thereby enabling high integration of a system and to reduce the length of electrical connection passages to be capable of coping with a high-speed device.

It is another object of the present invention to reduce the weight of a multi-chip package in order to increase the competitiveness of a portable communication device or the like which employs the multi-chip package.

It is still another object of the present invention to enhance the reliability of a multi-chip package by removing a primary factor of degradation such as fracture of connection parts caused by a package warping phenomenon.

In order to accomplish the above objects, according to the present invention, there is provided a multi-chip package comprising: a circuit substrate consisting of first, second and third areas which surround three sides of the multi-chip package; and at least two semiconductor chips which are positioned within an internal space of the package defined by the internal surfaces of the above three areas, wherein the semiconductor chips are physically bonded and electrically connected to each other.

In the multi-chip package according to the present invention, the circuit substrate comprises a plurality of substrate pads which are formed on the internal surfaces of the above three areas and electrically connected to the semiconductor chips. The semiconductor chips comprises a plurality of chip pads formed on the top surfaces of the semiconductor chips and a plurality of chip bumps individually formed on each of the chip pads, respectively corresponding chip bumps and substrate pads being physically bonded and electrically connected to each other.

In addition, the semiconductor chips comprises a first semiconductor chip provided on the first area, at least one second semiconductor chip provided on the second area, and a third semiconductor chip provided on the third area. Herein, a rear surface of the first semiconductor chip is faced to a rear surface of the third semiconductor chip and the first semiconductor chip and the third semiconductor chip may have an identical size.

Meanwhile, the circuit substrate may comprise a plurality of ball lands, which are formed on the external surface of the first area and electrically connected to the substrate pads, and in this case a plurality of solder balls may be respectively formed on the ball lands.

In addition, the circuit substrate may further comprise a fourth area which extends from a side of the third area and the fourth area may comprise a plurality of contact pads which are formed on a side of the four area and electrically connected to the substrate pads.

The circuit substrate preferably comprises a plurality of notches formed in the external surfaces of first, second and third areas at the boundaries of these three areas and the multi-chip package may further comprise an encapsulant filled in the internal space of the package.

According to another aspect of the present invention, there is provided a method for manufacturing a multi-chip package, comprising the steps of: providing a circuit substrate consisting of first, second and third areas; bonding two or more semiconductor chips to the internal surfaces of the above three areas so that those chips are physically bonded and electrically connected to the circuit substrate; and folding the circuit substrate so that the above three areas surround three sides of the package and the semiconductor chips are positioned within an internal space of the package defined by the internal surfaces of the three areas.

According to another aspect of the present invention, there is also provided a method for manufacturing a multi-chip package, comprising the steps of: providing a circuit substrate matrix formed with a plurality of unit circuit substrates, each substrate consisting of first, second and third areas; bonding two or more semiconductor chips to the internal surfaces of the above three areas of the unit circuit substrate, so that those chips are physically bonded and electrically connected to the unit circuit substrate; and folding the unit circuit substrate so that the above three areas surround three sides of the package and the semiconductor chips are positioned within an internal space of the package defined by the internal surfaces of the three areas.

BRIEF DESCRIPTION OF THE DRAWINGS

The above and other objects, features and advantages of the present invention will be more apparent from the following detailed description taken in conjunction with the accompanying drawings, in which:

FIGS. 4 to 17 show a method for manufacturing the multi-chip package shown in FIG. 3 stepwise, in which:

FIGS. 19 to 21 are drawings which show a multi-chip package in accordance with a third embodiment of the present invention and a method of manufacturing the same stepwise, in which:

DETAILED DESCRIPTION OF THE PREFERRED EMBODIMENTS

Hereinafter, a preferred embodiment of the present invention will be described with reference to the accompanying drawings. In the following description and drawings, the same reference numerals are used to designate the same or similar components, and so repetition of the description for the same or similar components will be omitted.

1. First Embodiment

Figure 3:
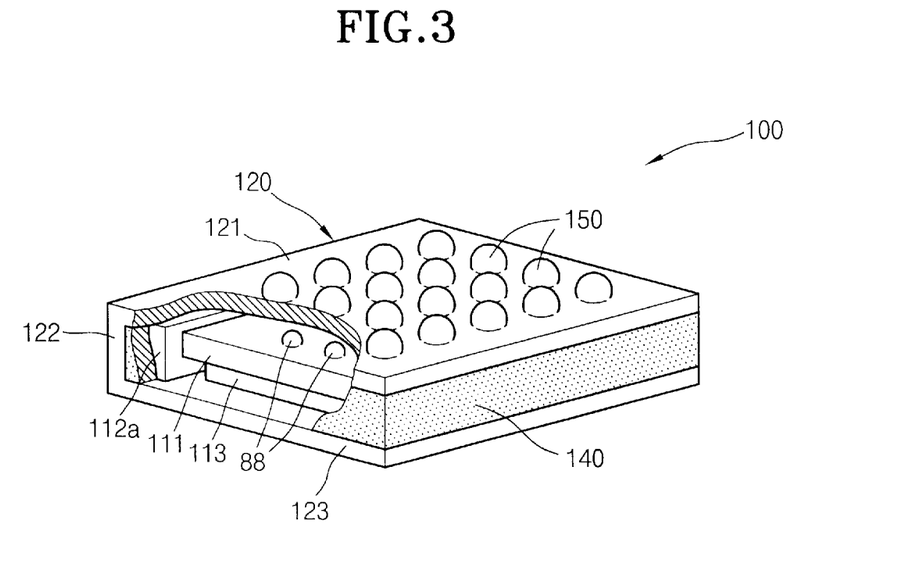
FIG. 3 is a perspective view of a multi-chip according to a first embodiment of the present invention.
Figure 17:
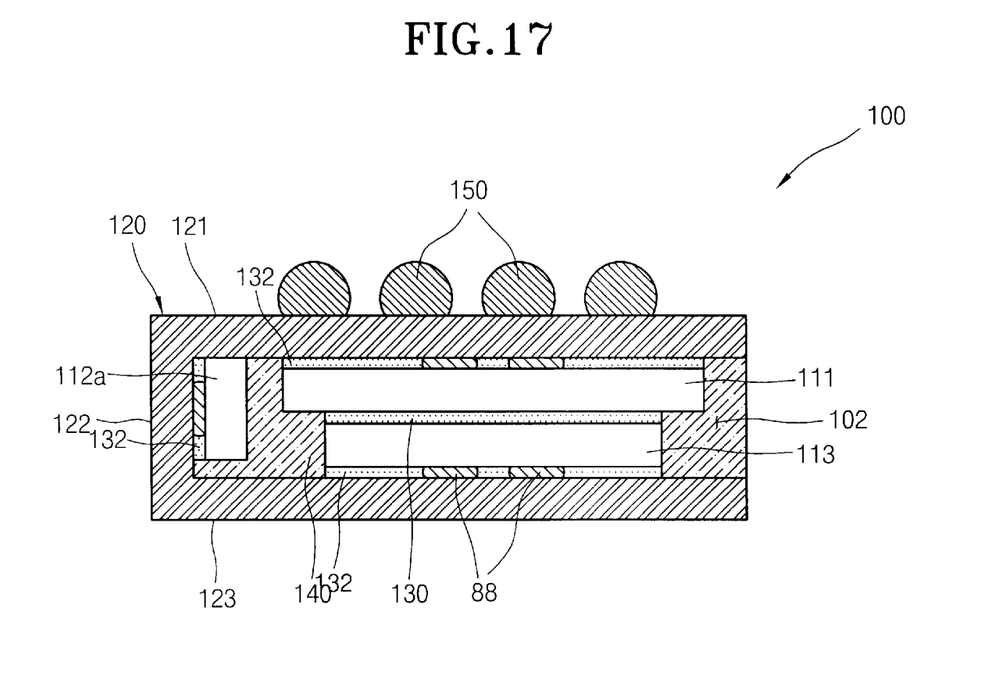
FIG. 17 is a cross-sectional view which shows the package formed with external terminals.
Figure 18:
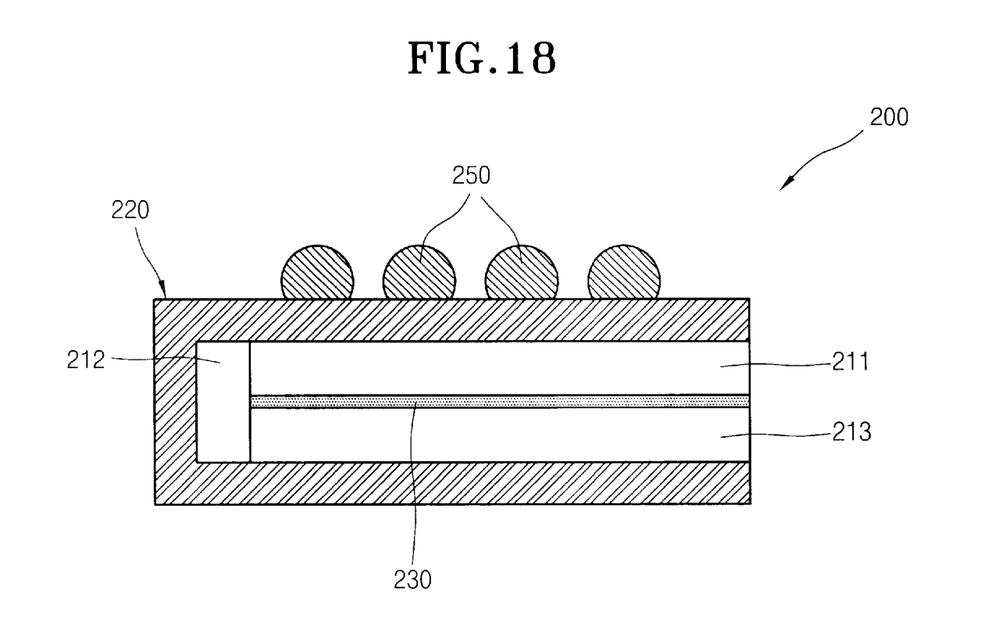
FIG. 18 is a cross-sectional view of a multi-chip package in accordance with a second embodiment of the present invention.

A multi-chip package according to a first embodiment of the present invention is shown in FIGS. 3 and 17 in a cross-sectional view and a perspective view. Referring to FIGS. 3 and 17, the multi-chip package 100 consists of four semiconductor chips 111, 112a, 112b and 113 (See FIGS. 11 to 13). The three sides of the multi-chip package 100 are surround by a circuit substrate 120, and all of the semiconductor chips 111, 112a, 112b and 113 are positioned in the internal space 102 of the package defined by the internal surface of the circuit substrate 120. Each of the semiconductor chips 111, 112a, 112b and 113 has a plurality of chip bumps 88 formed on the top surface and is physically and electrically connected to the internal surface of the circuit substrate 120.

The circuit substrate 120 consists of total three areas. The circuit substrate 120 is folded at the borderlines of these areas; a first area 121 forms a top surface of the package, a second area 122 forms one of the lateral surfaces of the package, and a third area 123 forms a bottom surface of the package. On the internal surface of the first area 121, the first semiconductor chip 111 is adhered, on the internal surface of the second area 122, the two second semiconductor chips 112a and 112b are adhered, and on the third area, the third semiconductor chip 113 is adhered. The rear surfaces of the first semiconductor chip 111 and the third semiconductor chip 113 are faced to and adhered with each other by an adhesive layer 130.

The internal surface 102 is filled with an encapsulant 140, and on the outer surface of the first area 121 of the circuit substrate, a plurality of solder balls 150 are formed. The solder balls 150 are electrically connected to individual semiconductor chips 111, 112a, 112b and 113 through the circuit substrate 120.

The multi-chip package 100 according to the first embodiment is manufactured in the following manner. The construction of the multi-chip package 100 will be more apparent from the method of manufacturing the multi-chip package 100 to be described below with reference to FIGS. 4 to 17.

Figure 4:
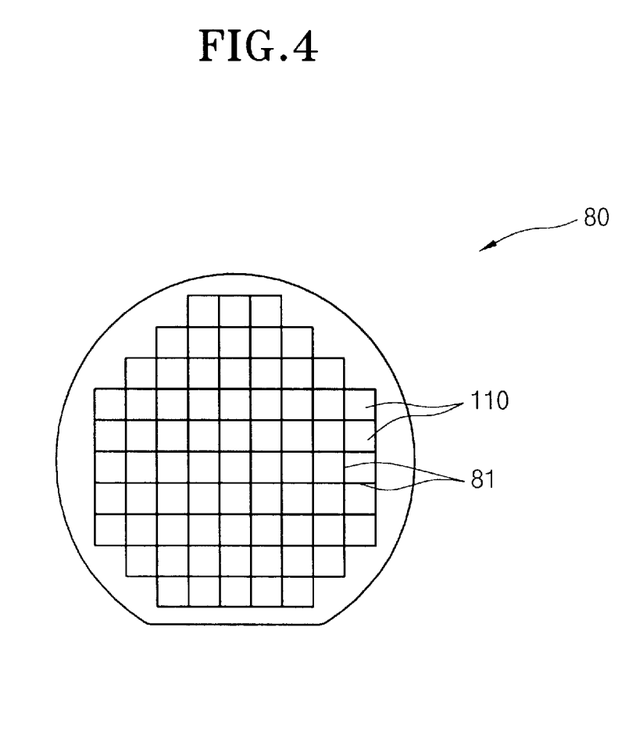
FIG. 4 is a plan view which schematically shows a wafer formed with chip bumps.
Figure 5:
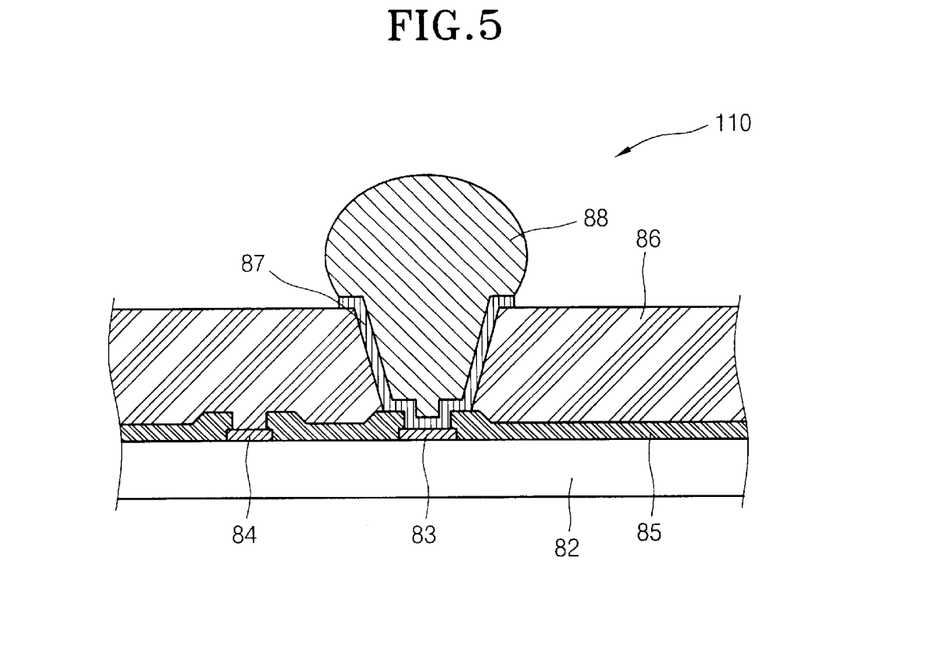
FIG. 5 is a cross-sectional view showing a bump in detail.
Figure 6:
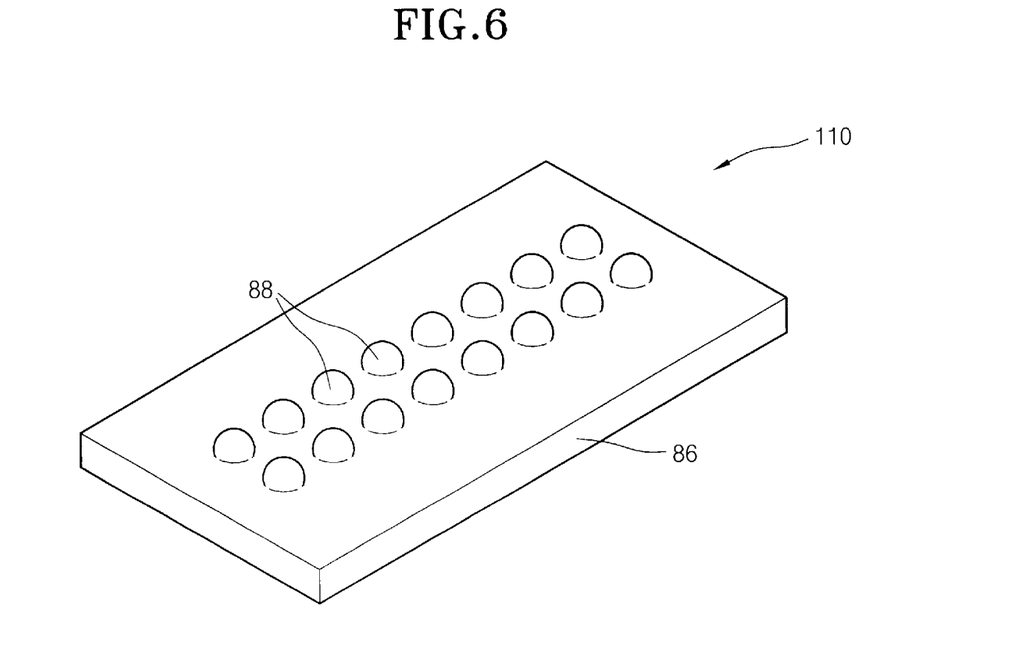
FIG. 6 is a perspective view which shows an individual semiconductor chip separated from the wafer.
Figure 15:
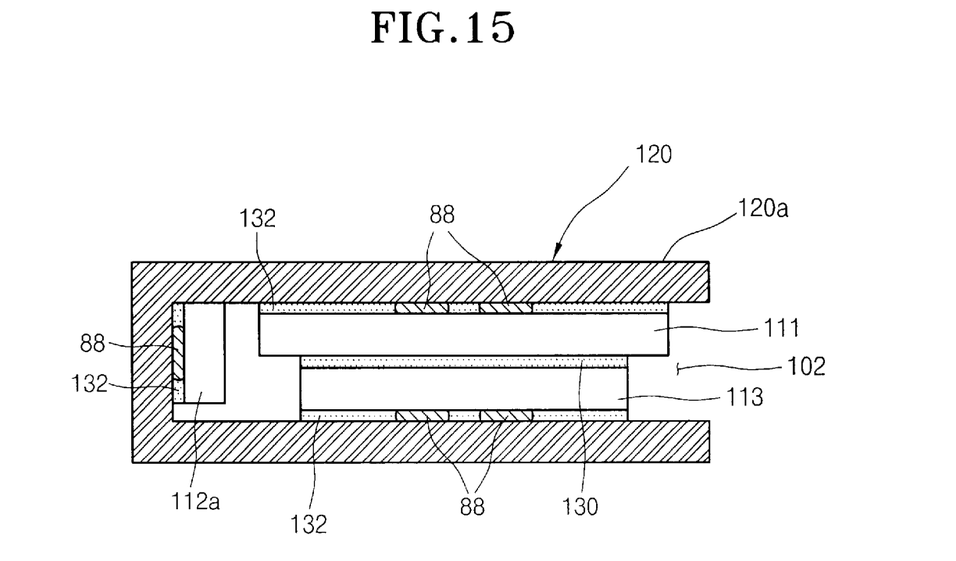
FIG. 15 is a cross-sectional view which shows a unit circuit substrate in the folded state.

FIG. 4 is a plan view which schematically shows a wafer 80 formed with chip bumps. As shown in FIG. 4, the wafer 80 contains tens to hundreds of semiconductor chips 100. Individual semiconductor chips 110 are defined by scribed lanes 81 and each semiconductor chip 110 is obtained by cutting the wafer 80 along the scribed lanes 81. The top surface of each semiconductor chip 110 is formed with a plurality of chip pads and each chip pad is formed with a chip bump. The detailed construction of the chip bump formed on the chip pad is shown in FIG. 15 in a cross-sectional view and one individual semiconductor chip 110 separated from the wafer 80 is shown in FIG. 6 in a perspective view. Referring to FIGS. 5 and 6, a given integrated circuit area 82 of the semiconductor chip 110 is covered with a passivaion layer 85, thus being protected from the external environment. The chip pad 83 electrically connected to the integrated circuit area 82 is exposed through the passivation layer 85. A buffer layer 86 is formed on the passivation layer 85, and a part of the chip pad 83 is exposed through a photolithography process. An under-bump metal (UBM) 87 is formed on the top surface of the exposed chip pad 83 and the lateral surfaces of the buffer layer 86 and the chip bump 88 are formed on the UBM.

The passivation layer 85 is formed from an oxide or nitride film, and the buffer layer 86 is formed from polyimide, benzocyclobutene (BCB) or the like. The buffer layer 86 is formed to relieve thermal stress that may affect on the chip bump 88 subsequently and after the semiconductor chip 110 is bonded to a circuit substrate through the chip bump 88. The UBM 87 is formed from a metal such as copper, chromium, nickel, gold, etc. and serves as a glue layer, an anti-diffusion layer, etc. The chip bump 88 may be formed through a screen print or reflow process of solder paste, for example. Alternatively, the chip bump 88 may formed through deposition, plating, stud bumping, etc. using other material such as gold or the like. In FIG. 5, reference numeral 84 designates a fuse that is used for repairing a semiconductor chip having a faulty cell. A main component, which forms the multi-chip package of the present invention with one or more semiconductor chips, is a circuit substrate. A circuit substrate used for the multi-chip package according to the first embodiment is shown in FIGS. 7 to 10.

Figure 7:
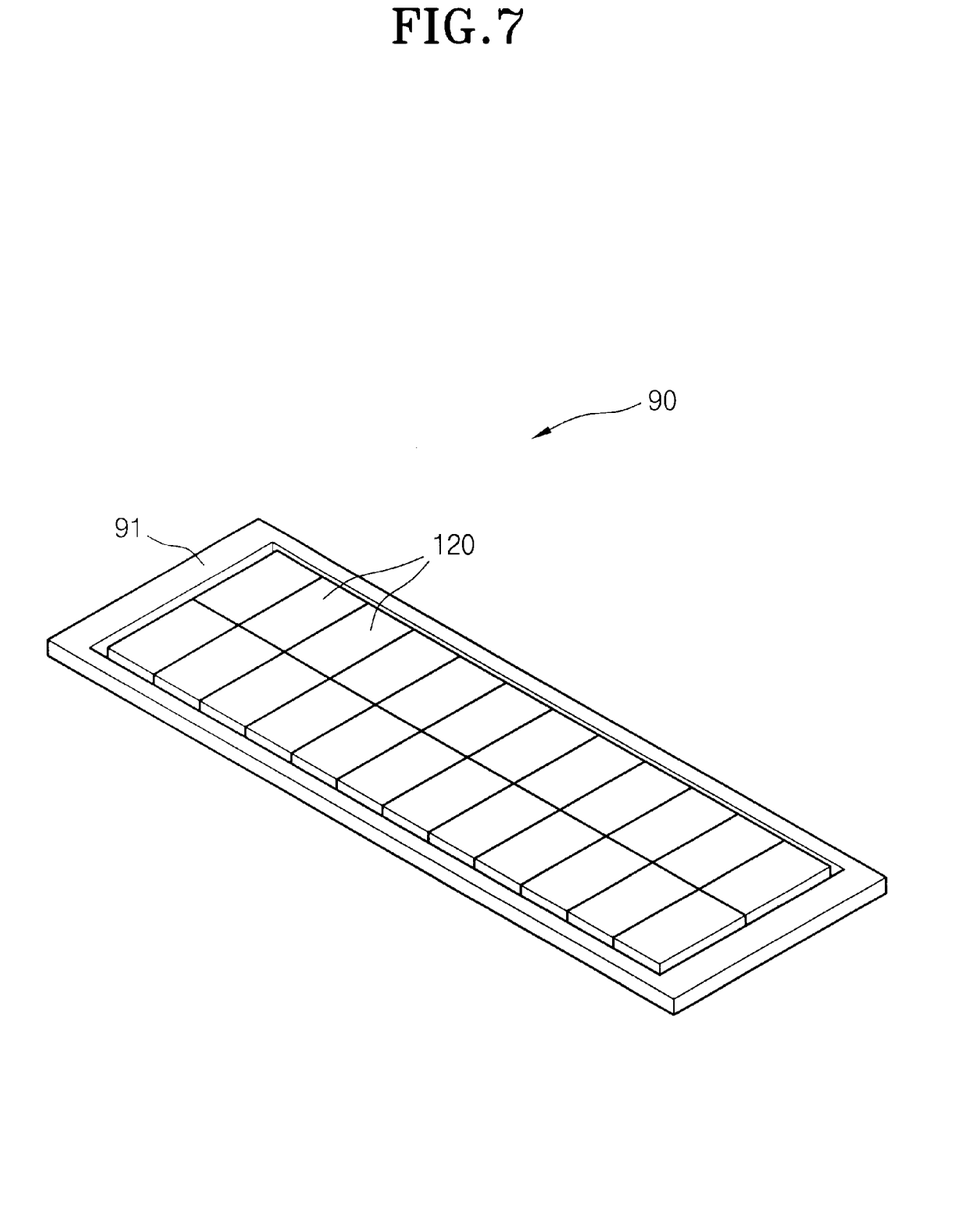
FIG. 7 is a perspective view a matrix of circuit substrate.
Figure 8:
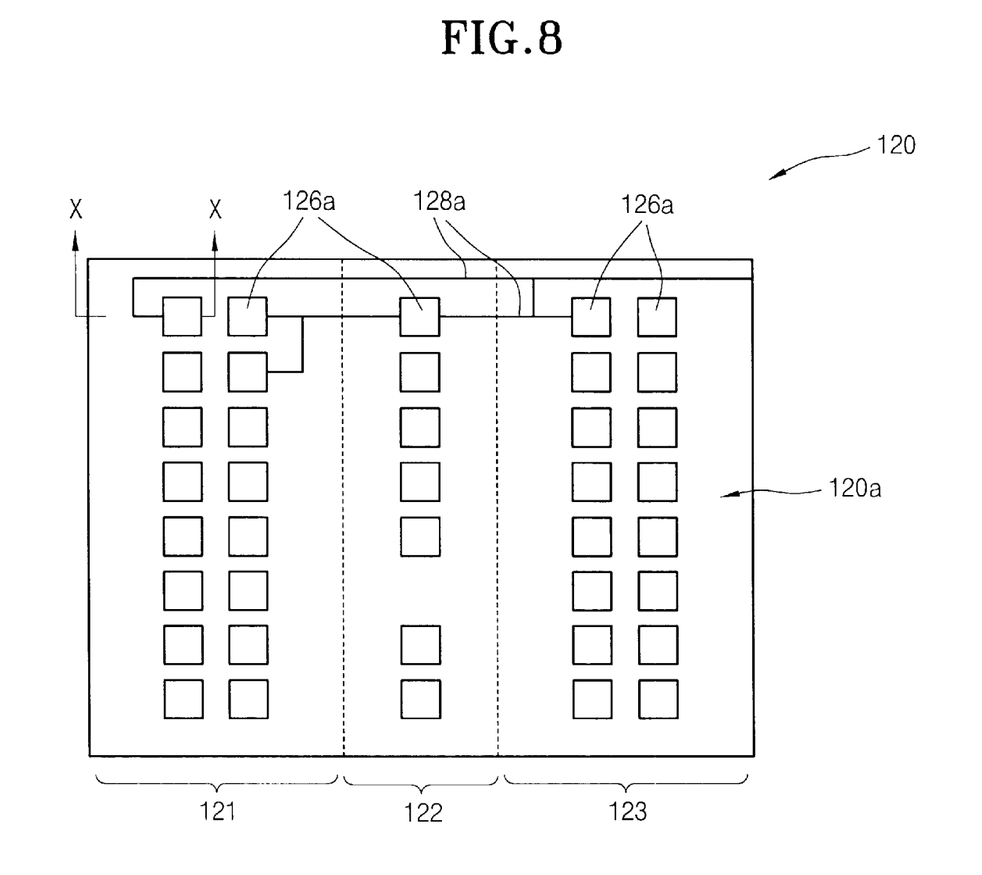
FIG. 8 is a plan view which shows an internal surface of a unit circuit substrate.
Figure 9:
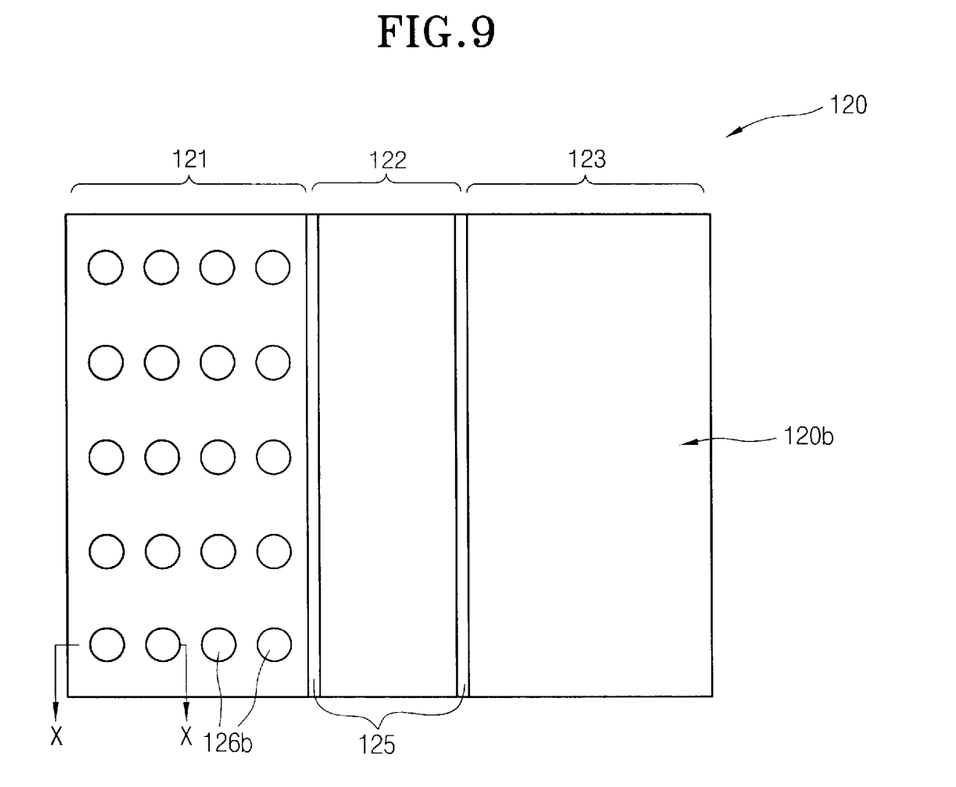
FIG. 9 is a plan view which shows an outer surface of the unit circuit substrate.
Figure 10:
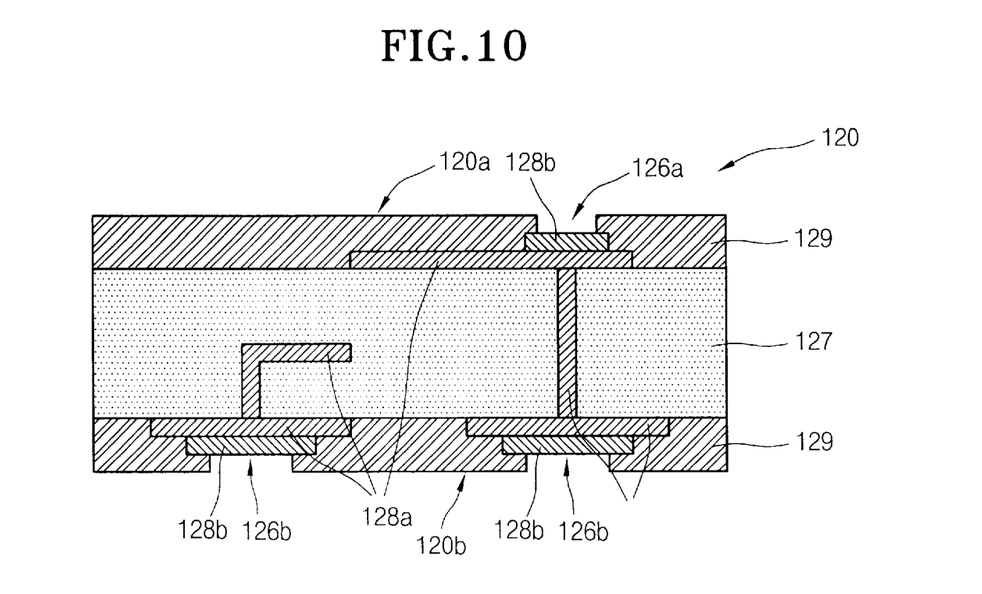
FIG. 10 is a cross-sectional view taken in the direction of X—X.

Several tens of circuit substrates are collectively produced per one batch and used for manufacturing packages. Hereinafter, a batch of circuit substrates so produced is referred as "circuit substrate matrix" and each circuit substrate is referred as "unit circuit substrate." FIG. 7 schematically shows one circuit substrate matrix 90, and FIGS. 8 to 10 show one unit circuit substrate 120. In particular, FIGS. 8 and 9 are top and bottom plan views which show internal surface 120a and outer surface 120b of the unit circuit substrate 120, respectively, and FIG. 10 is a cross-sectional view taken along the line X—X of FIG. 9. As shown in FIG. 7, the circuit substrate is manufactured in a state in which several tens of unit circuit substrates 120 are fixed on a metal frame. An adhesive tape 92 (FIG. 14) is adhered on the bottom surface of the metal frame 91 and the bottom surfaces (i.e., outer surface) of the unit circuit substrates.

Figure 11:
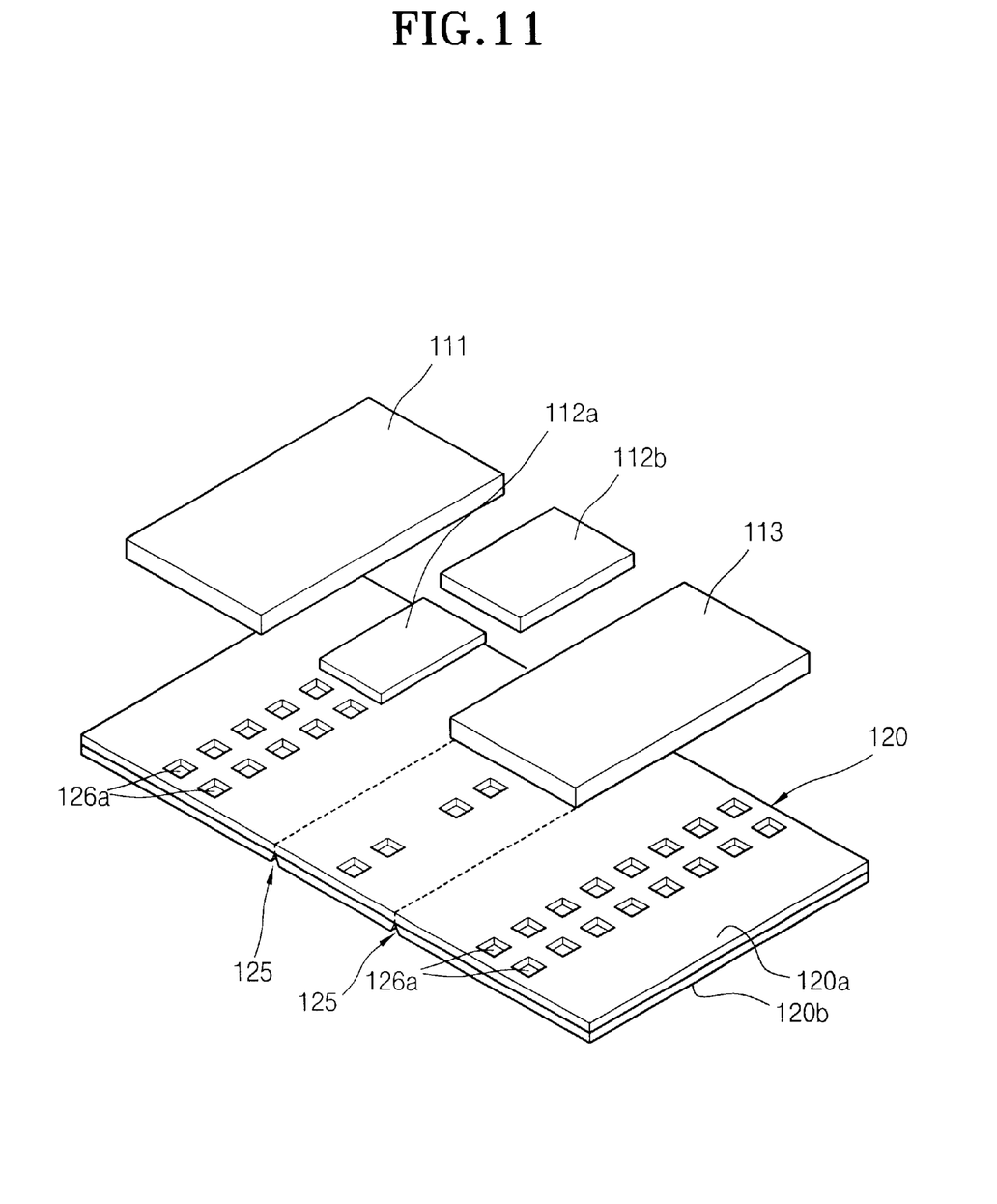
FIG. 11 is a perspective view which shows the state in which a plurality of semiconductor chips are arranged on the unit circuit substrate.
Figure 12:
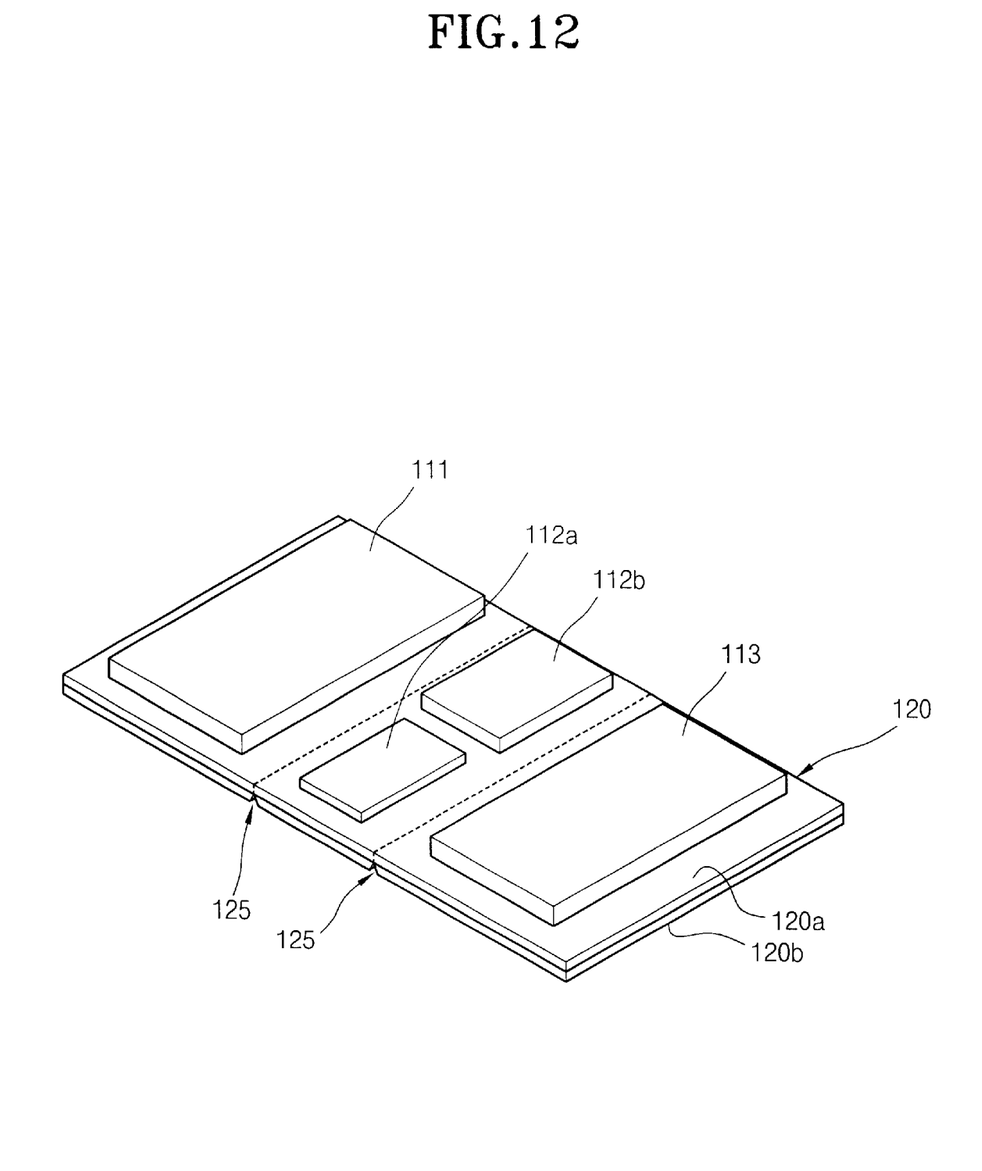
FIG. 12 is a perspective view which shows the state in which a plurality of semiconductor chips are adhered on the unit circuit substrate.

Referring to FIGS. 8 and 10, the unit circuit substrate 120 consists of three areas 121, 122 and 123 as described above. Borderlines between the areas 121, 122 and 123 of the outer surface 120b of the unit circuit substrate are formed with notches 125. The notches 125 allow the unit circuit substrate to be easily folded afterward. The body of the unit circuit substrate 120 is formed from BT resin (127). Predetermined copper wiring 128a and plating layers 128b are formed within the BT resin layer 127 and on the top and bottom surfaces of the BT resin layer 127, and solder resist layers 129 are also formed on each of the top and bottom surfaces of the BT resin layer 127. The copper wiring 128a and the plating layers 128b exposed in the internal surface 120a of the unit circuit substrate form substrate pads 126a, and the copper wiring 128a and the plating layers 128b exposed external surface 120b form ball lands. The substrate pads to be bonded with chip bumps of a semiconductor chip are formed throughout the entire areas 121, 122 and 123 of the unit circuit substrate 120, and the ball lands to be bonded with solder balls are formed on the first area 121 of the unit circuit substrate 120 only. The plating layer, which is used for improving the adhesiveness between the chip bumps and the solder balls is formed from, for example, gold and nickel. The step for bonding semiconductor chips on the circuit substrate is shown in FIGS. 11 and 12. The chips 111, 112a, 112b and 113 are arranged on the internal surface 120a of the unit circuit substrate 120 as shown in FIG. 11 and then bonded as shown in FIG. 12. Herein, the chip bumps (designated by reference numeral 88 in FIG. 6) formed on the top surface of the semiconductor chips are physically bonded to the substrate pads 126a formed on the internal surface 120a of the unit circuit substrate. Although not shown in the drawing, flux (designated by reference numeral 132 in FIG. 15) is applied on the internal surface 120a of the unit circuit substrate in advance before the substrate pads 126 and the chip bumps 88 are bonded with each other. The flux 132 not only assists the chip bumps 88 and the substrate pads 126a to be bonded, but also serves to fill up the gaps between the top surface of the semiconductor chip and the internal surface 120a of the circuit substrate. For the flux 132, for example, nonconductive polyimide may be used.

Figure 13:
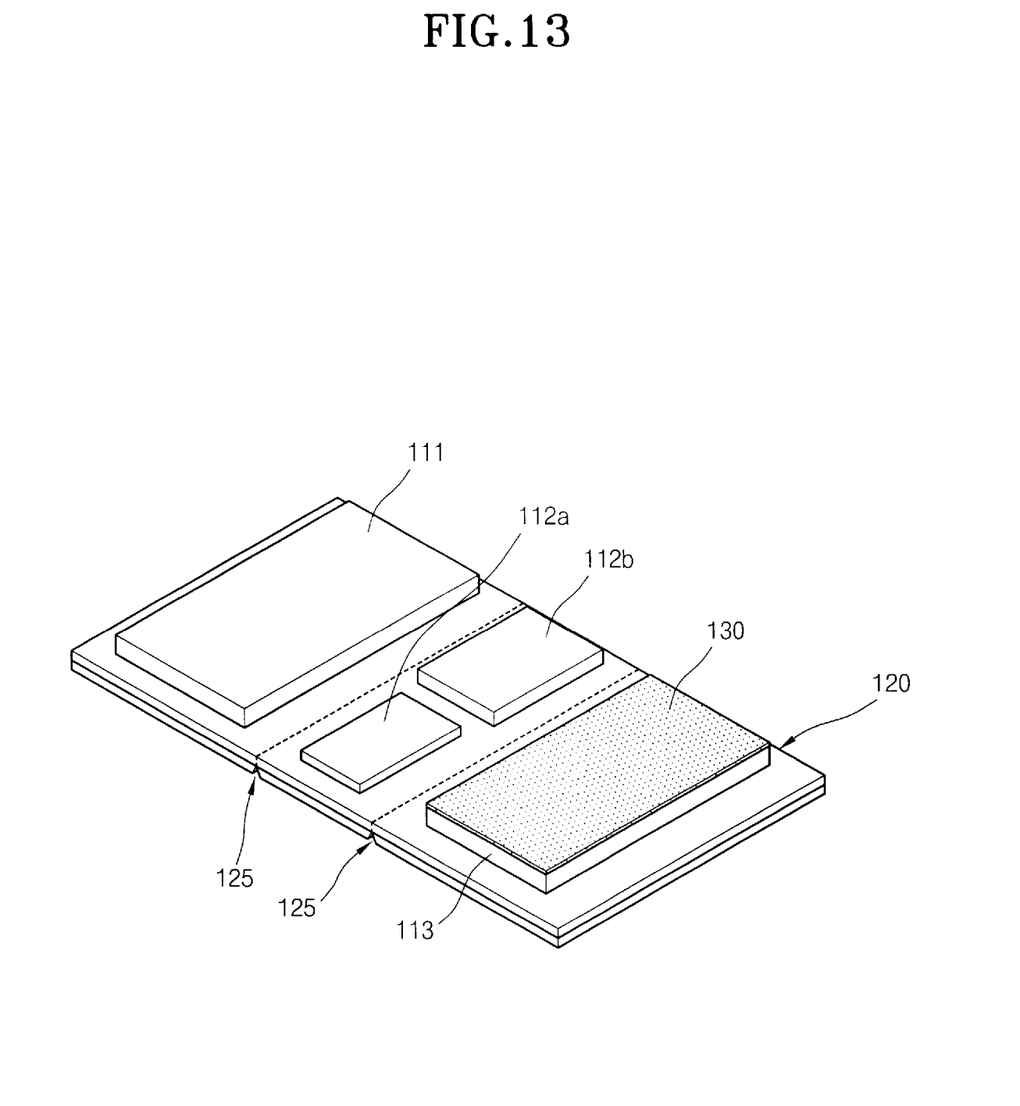
FIG. 13 is a perspective view which shows the state in which an adhesive layer is formed on a semiconductor chip.

After bonding the semiconductor chips 111, 112a, 112b and 113 on the circuit substrate 120, an adhesive layer 130 is formed on the rear surface of the third semiconductor chip 113 as shown in FIG. 13. In order to form the adhesive layer 130, it is possible to attach an adhesive tape or apply a liquid adhesive.

Figure 14:
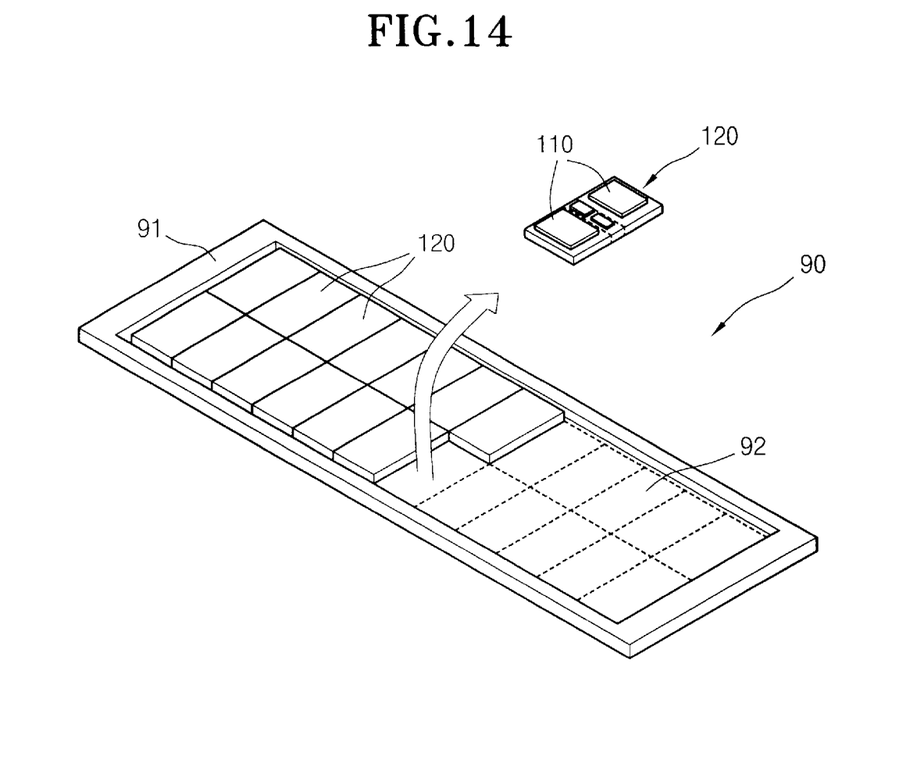
FIG. 14 is a perspective view which show the step of separating a unit circuit substrate.

Following this, each of the circuit substrates 120 is separated from the circuit substrate matrix 90 as shown in FIG. 14. Each unit circuit substrate 120 on which one or more semiconductor chips 110 are attached, is remained attached and fixed on the adhesive tape 92 of the circuit substrate matrix 90, as described above. In this state, each unit circuit substrate may be separated using a pickup device while illuminating ultra violet rays to weaken the adhesion strength of the adhesive tape 92 or while pushing upward the unit circuit substrate 120 from the below of the adhesive tape 92. The step for separating such a unit circuit substrate 120 may be performed prior to the step for forming the adhesive layer (130 in FIG. 13) on the rear surface of the third semiconductor chip (113 in FIG. 13).

Then, the unit circuit substrate 120 is folded in the form of a package as shown in FIG. 15. That is, the circuit substrate 120 is folded so that adjacent areas form an angle of 90°. As a result, all of the semiconductors 111, 112a, 112b and 113 bonded on the internal surface 120a of the circuit substrate 120 are positioned within an internal space 102 surrounded by the folded circuit substrate 120. In addition, the rear surfaces of the first semiconductor chip 111 and the third semiconductor chips 113 are faced and bonded with each other through the adhesive layer 130 previously formed on the third semiconductor chip 113.

Figure 16:
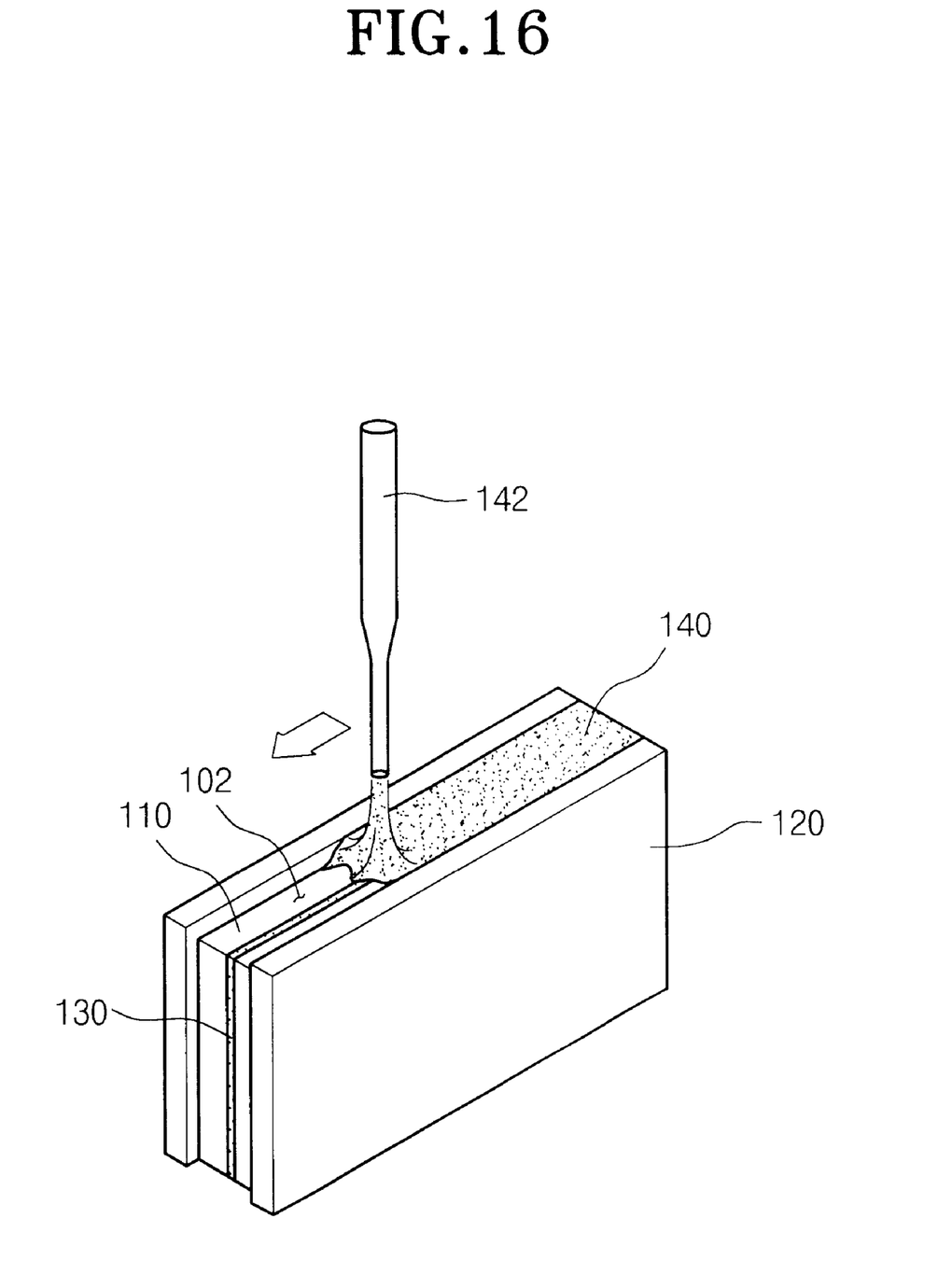
FIG. 16 is a cross-sectional view which shows the step of filling an encapsulant within the internal space of the package.

Next, the internal space 102 of the package is filled with an encapsulant 140 to protect the internal surface of the circuit substrate 120 and the semiconductor chips 110, as shown in FIG. 16. For the encapsulant 140, liquid epoxy resin containing an amount of silica filler may be used; the encapsulant 140 is dispensed by means of a dispensing nozzle and then cured. The silica filler serves to prevent the abrupt thermal expansion of the encapsulant 140 at a high temperature.

Thereafter, a plurality of solder balls 150 are formed which serve as external connection terminals of the package 100, as shown in FIG. 17. The solder balls are formed on the ball lands (126b in FIG. 9) exposed on the first area 121 of the circuit substrate 120 through the flux application and reflow processes.

The afore-mentioned first embodiment of the present invention is related to an example of an ordinary case in which various types of semiconductor chips of different sizes and functions are assembled into one multi-chip package. For example, a system-on-package is implemented by incorporating a DRAM, an SRAM, a flash memory and an RF chip. Accordingly, in the first embodiment, the first semiconductor chip 111 and the third chip 113 are generally of different sizes. Due to this, the internal space 102 is remained insufficiently filled even if the semiconductor chips 111, 112a, 112b and 113 are bonded on the circuit substrate 120 and it is requested to fill the space with the encapsulant 140. However, if the first and third semiconductor chips are of same size and the circuit substrate is fabricate considering this size including the sizes of the second semiconductors, it may be needless to use an encapsulant. The second embodiment is directed toward such a case.

2. Second Embodiment

FIG. 12 shows a multi-chip package 200 according to the second embodiment of the present invention. As shown in the drawing, the sizes of the first semiconductor chip 211 and the third semiconductor chip 213 are same with each other. For example, two memory chips of same type may be used to increase the memory capacity. In addition, the width of the internal surface of first area and the width of the internal surface of the third area are equal and the width is equal to the thickness of the second semiconductor chip 212 plus the width of the first semiconductor chip 211.

Therefore, it is sufficient to bond the rear surfaces of the first semiconductor chip 211 and third semiconductor chip 213 with each other through the adhesive layer 230 and it is needless to use an encapsulant as in the first embodiment. The other construction and manufacturing steps of the second embodiment are identical to those of the afore-mentioned first embodiment.

Meanwhile, the first and second embodiments are examples of using solder balls 150 and 250 as external connection terminals of the packages 100 and 200. However, the multi-chip package according to the present invention may employ other external connection terminals of a type different from the solder balls. The third embodiment of the present invention is an example of the cases in which the external connection terminals of a type different from the solder balls and a corresponding circuit substrate are employed.

3. Third Embodiment

Figure 19:
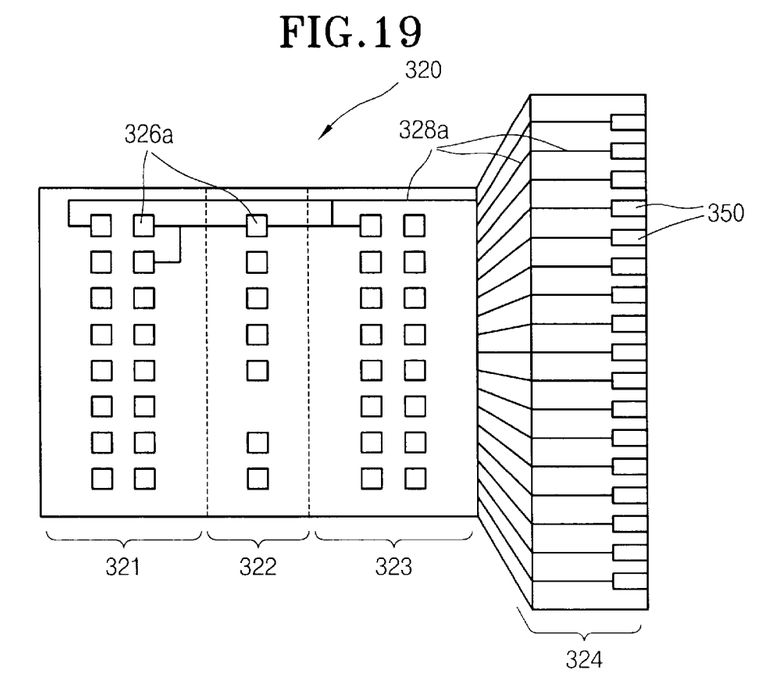
FIG. 19 is a plan view which shows an internal surface of a unit circuit substrate.
Figure 20:
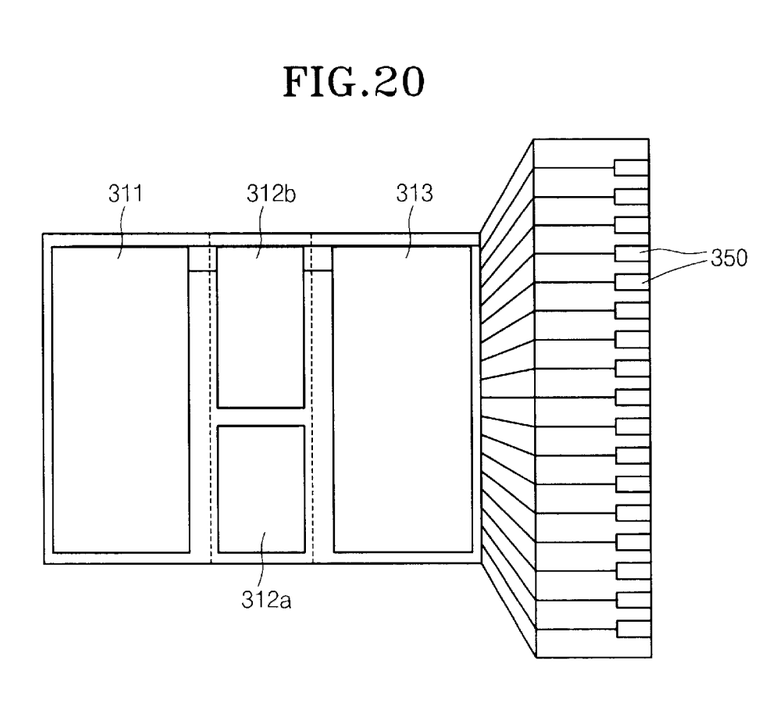
FIG. 20 is a perspective view which shows the state in which a plurality of semiconductor chips are adhered on the unit circuit substrate.
Figure 21:
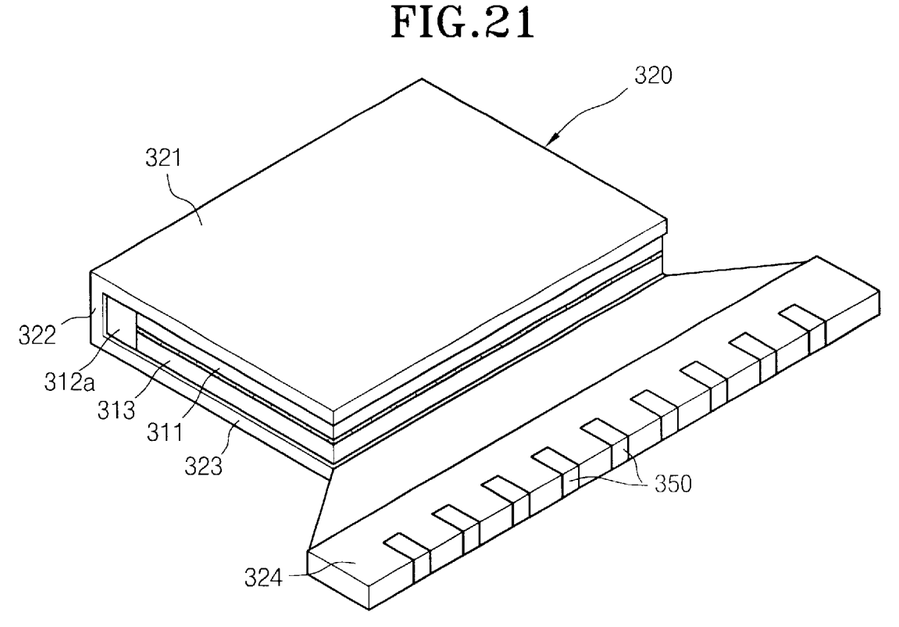
FIG. 21 is a cross-sectional view which shows a unit circuit substrate in the folded state.
Figure 22:
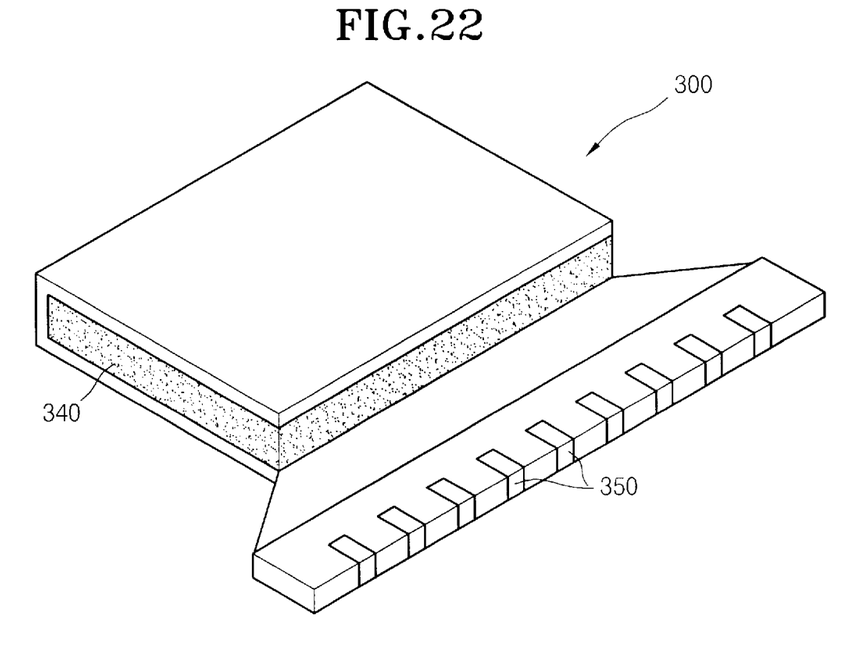
FIG. 22 is a cross-sectional view which shows the step of filling encapsulant within the internal space of the package.

FIGS. 19 to 22 show a multi-chip package 300 according to the third embodiment of the present invention and manufacturing method thereof stepwise, in which FIG. 19 is a plan view which shows the surface of the unit circuit substrate 320 which will form the internal surface of the multi-chip package, FIG. 20 is a plan view which shows the unit circuit substrate 320 with semiconductor chips 311, 312a, 312b and 313 being mounted thereon, FIG. 21 is a perspective view which shows the unit circuit substrate 320 in a folded state, and FIG. 22 is a perspective view which shows the state in which an encapsulant 340 is filled in the internal space of the package.

As shown in the drawings, unlike the afore-mentioned embodiments, the circuit substrate 320 consists of four areas 321, 322, 323 and 324. In particular, the fourth area 324 is extended from a side of the third area 323 and formed in a plug-in socket type. The external connection terminals of the package are a plurality of contact pads 350 formed on a side of the fourth area 324. The multi-chip package of the third embodiment has an advantage in that it is excellent in package mountability and easiness of system upgrade because it is easy to insert the fourth area 324 of the plug-in socket type formed with the contact pads 350 into a system and to remove from the system.

Meanwhile, because the contact pads 350 are formed on a side of the circuit substrate 320 and connected to the substrate pads 326a through copper wiring 328a, it is not required to form the copper wiring 328a on the external surface of the circuit substrate 320 unlike the aforementioned embodiments. Further more, the ball lands such as indicated by reference numeral 126b in FIG. 10 and solder resist formed on the external surface such as indicated by reference numeral 127 in FIG. 10 are not required to be formed. Therefore, the thickness of the circuit substrate 320 is reduced to such a degree.

Although three embodiments have been described but the present invention is not limited to those embodiments.

For example, in the afore-mentioned embodiments, the number of the second semiconductor chips is described as two, but the present invention is not limited to the case. It is possible to use only one semiconductor chip or three semiconductor chips for the second semiconductor chips as desired. Occasionally, it is also possible that no semiconductor chip is employed.

In order to form a thin film type package, the multi-chip package according to the present invention implements the adhesion of semiconductor chips to the circuit substrate using chip bumps formed on the semiconductor chips. Therefore, in the case of the second semiconductor chip that does not influence on the thickness of the package, it is possible to implement electrical connection between the chip pads and substrate pads using ordinary wire bonding without forming chip bumps.

In addition, although it is preferable to form chip bumps of the present invention on chip pads in a semiconductor chip, the case is not excluded in which the chip bumps are formed on the substrate pads of a circuit substrate.

Furthermore, although the multi-chip package manufacturing method of the present invention is preferably formed employing a circuit substrate matrix formed with a plurality of unit circuit substrate, it is possible to implement the present invention in terms of unit circuit substrates.

As can be appreciate from the above, the multi-chip package according to the present invention and the manufacturing method thereof have following advantages:

1. It is possible to minimize the thickness and area of a system due to the constructional characteristics of the multi-chip package of the present invention, which allow the high densification of semiconductor chips; accordingly, the high integration of a system can be realized;
2. A multi-chip package of the present invention can implement electrical connection between semiconductor chips and a circuit substrate using chip bumps, and also implement electrical connection between the package and a system using solder balls; accordingly, the length of electrical connection passages can be extremely reduced and electric performances can be enhanced, so that it is possible to advantageously cope with a high-speed electronic device;
3. A multi-chip package of the present invention does not use a lead frame nor an epoxy molding compound; accordingly the weight of a multi-chip package can be reduced, so that the multi-chip package can be applied to a portable communication device or the like and enhance the competitiveness of a product which incorporates such a package;
4. Fracture of a connection part, which has been generated in conventional multi-chip packages due to the package warping phenomenon, is not generated in the multi-chip package of the present invention; accordingly it is possible to enhance the reliability of a multi-chip package;
5. According to the present invention, not only it is possible to extend the memory capacity by forming a multi-chip package using memory chips of a same type, but also it is possible to form a system-on package that can implement various functions by compositely forming a multi-chip package using memory chips of different types;
6. A multi-chip package according to an embodiment of the present invention employs plug-in socket type external connection terminals; accordingly it is easy to mount the multi-chip package into and remove it from a system, and it is also easy to grade up the system; and
7. Due to a circuit substrate being used, the method of manufacturing a multi-chip package according to the present invention is can be performed in simple processes and at a low cost.

The preferred embodiment of the present invention has been shown and described are used for the illustrative purposes, and those skilled in the art will appreciate that various modifications, additions and substitutions are possible, without departing from the scope and spirit of the invention as disclosed in the accompanying claims.

What is claimed is:

1. A method for manufacturing a multi-chip package, comprising the steps of:

providing a circuit substrate consisting of first, second and third areas;

bonding two or more semiconductor chips to the internal surfaces of the above three areas so that those chips are physically bonded and electrically connected to the circuit substrate; and folding the circuit substrate so that the above three areas surround three sides of the package and the semiconductor chips are positioned within an internal space of the package defined by the internal surfaces of the three areas.

2. A method for manufacturing a multi-chip package, comprising the steps of:

providing a circuit substrate matrix formed with a plurality of unit circuit substrates, each substrate consisting of first, second and third areas;

bonding two or more semiconductor chips to the internal surfaces of the above three areas of the unit circuit substrate, so that those chips are physically bonded and electrically connected to the unit circuit substrate; and folding the unit circuit substrate so that the above three areas surround three sides of the package and the semiconductor chips are positioned within an internal space of the package defined by the internal surfaces of the three areas.

3. The method according to claim 2, wherein the unit circuit substrates forms the circuit substrate matrix in the state of being fixed on a metal frame by an adhesive tape.

4. The method according to claim 2, wherein the semiconductor chip bonding step comprises the steps of:

arranging the chip bumps formed on the top surfaces of the semiconductor chips and the substrate pads formed on the internal surface of the unit circuit substrate; and physically bonding the chip bumps and the substrate pads.

5. The method according to claim 4, further comprising the step of applying flux to the internal surface of the unit circuit substrate prior to the semiconductor chip bonding step.

6. The method according to claim 2 or 4, wherein the semiconductor chip bonding step comprising the steps of:

bonding a first semiconductor chip to the first area;

bonding at least one semiconductor chip to the second area; and bonding a third semiconductor chip to the third area.

7. The method according to claim 6, further comprising the step of forming an adhesive layer on a rear surface of the first or third semiconductor chip, prior to or after the step of separating the unit circuit substrate from the circuit substrate matrix.

8. The method according to claim 2, wherein the unit circuit substrate folding step is performed with reference to notches formed in the external surfaces of the first to third areas at the boundaries of these three areas.

9. The method according to claim 2, further comprising the step of filling an encapsulant into the internal space of the package after the unit circuit substrate folding step.

10. The method according to claim 2 or 9, further comprising the step of forming a plurality of solder balls on the external surface of the first area after the unit circuit substrate folding step.

* * * * *